(12) United States Patent
Iijima et al.

(10) Patent No.: US 7,183,217 B2
(45) Date of Patent: Feb. 27, 2007

(54) DRY-ETCHING METHOD

(75) Inventors: Etsuo Iijima, Nirasaki (JP); Akiteru Koh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 39 days.

(21) Appl. No.: 10/481,645

(22) PCT Filed: Jun. 7, 2002

(86) PCT No.: PCT/JP02/05636

§ 371 (c)(1), (2), (4) Date: Dec. 22, 2003

(87) PCT Pub. No.: WO03/001577

PCT Pub. Date: Mar. 1, 2003

(65) Prior Publication Data

US 2004/0171254 A1 Sep. 2, 2004

(30) Foreign Application Priority Data

Jun. 22, 2001 (JP) .............................. 2001-189579
Jan. 21, 2002 (JP) .............................. 2002-012206

(51) Int. Cl.
*H01L 21/311* (2006.01)

(52) U.S. Cl. ................. 438/701; 438/700; 438/978; 257/E21.233

(58) Field of Classification Search ............... 438/689, 438/706, 707, 710, 753, 700, 701, 424, 978; 257/E21.218, E21.233
See application file for complete search history.

(56) References Cited

U.S. PATENT DOCUMENTS

| 4,729,815 | A | * | 3/1988 | Leung | 438/714 |
|---|---|---|---|---|---|
| 4,855,017 | A | * | 8/1989 | Douglas | 438/695 |
| 5,078,833 | A | * | 1/1992 | Kadomura | 438/696 |
| 5,258,332 | A | * | 11/1993 | Horioka et al. | 438/389 |
| 5,316,616 | A | * | 5/1994 | Nakamura et al. | 438/713 |
| 5,522,966 | A | * | 6/1996 | Komura et al. | 438/701 |
| 5,651,858 | A | * | 7/1997 | Lin | 438/706 |
| 5,807,789 | A | * | 9/1998 | Chen et al. | 438/714 |
| 5,843,846 | A | * | 12/1998 | Nguyen et al. | 438/713 |
| 5,880,004 | A | * | 3/1999 | Ho | 438/421 |
| 5,882,982 | A | * | 3/1999 | Zheng et al. | 438/424 |

(Continued)

FOREIGN PATENT DOCUMENTS

GB 2331624 5/1999

(Continued)

*Primary Examiner*—Walter Lindsay, Jr.
*Assistant Examiner*—Stanetta Isaac
(74) *Attorney, Agent, or Firm*—Oblon, Spivak, McClelland, Maier & Neustadt, P.C.

(57) ABSTRACT

A dry-etching method using an apparatus where a wafer is placed on either of a pair of opposed electrodes provided in an etching chamber, and high-frequency power is supplied to both the opposed electrodes to effect a plasma etching. The plasma etching uses a gas containing at least $Cl_2$ and HBr. Trenches 104a, 104b are formed, as shown in FIG. 1B, in a silicon wafer 101 shown in FIG. 1A through a mask layer such as a nitride silicon layer 103. While adjusting the high-frequency power supplied to the opposed electrode where the wafer is placed, the shape of the sidewalls 105a, 105b of the trenches 104a, 104b is controlled. Thus, the trenches can have desired shapes even if the widths of the trenches are different.

7 Claims, 8 Drawing Sheets

U.S. PATENT DOCUMENTS

| | | | | |
|---|---|---|---|---|
| 6,008,131 A * | 12/1999 | Chen | | 438/710 |
| 6,103,635 A * | 8/2000 | Chau et al. | | 438/739 |
| 6,124,212 A * | 9/2000 | Fan et al. | | 438/709 |
| 6,136,211 A * | 10/2000 | Qian et al. | | 216/37 |
| 6,174,785 B1 * | 1/2001 | Parekh et al. | | 438/424 |
| 6,225,187 B1 * | 5/2001 | Huang et al. | | 438/424 |
| 6,390,019 B1 * | 5/2002 | Grimbergen et al. | | 118/723 R |
| 6,432,832 B1 * | 8/2002 | Miller et al. | | 438/713 |
| 6,444,540 B2 * | 9/2002 | Kawada et al. | | 438/424 |
| 6,500,727 B1 * | 12/2002 | Chen et al. | | 438/424 |
| 6,527,968 B1 * | 3/2003 | Wang et al. | | 216/67 |
| 6,544,860 B1 * | 4/2003 | Singh | | 438/424 |
| 6,583,020 B2 * | 6/2003 | Uhlig et al. | | 438/387 |
| 6,709,984 B2 * | 3/2004 | Saito et al. | | 438/700 |
| 6,712,927 B1 * | 3/2004 | Grimbergen et al. | | 156/345.24 |
| 6,787,054 B2 * | 9/2004 | Wang et al. | | 216/72 |
| 6,821,900 B2 * | 11/2004 | Athavale et al. | | 438/700 |
| 6,821,901 B2 * | 11/2004 | Song et al. | | 438/700 |
| 6,827,869 B2 * | 12/2004 | Podlesnik et al. | | 216/17 |
| 6,844,265 B2 * | 1/2005 | Ouchi | | 438/706 |
| 6,849,554 B2 * | 2/2005 | Rattner et al. | | 438/706 |
| 2002/0068377 A1 * | 6/2002 | Oku et al. | | 438/105 |
| 2004/0077163 A1 * | 4/2004 | Chang et al. | | 438/689 |
| 2004/0147126 A1 * | 7/2004 | Yamashita et al. | | 438/689 |

FOREIGN PATENT DOCUMENTS

| | | |
|---|---|---|
| JP | 57-131374 | 8/1982 |
| JP | 2-14548 | 1/1990 |
| JP | 2-260424 | 10/1990 |
| JP | 3-141640 | 6/1991 |
| JP | 11-243080 | 9/1999 |
| JP | 2000-294626 | 10/2000 |
| KR | 1998-0012064 | 4/1998 |

* cited by examiner

DRY-ETCHING METHOD

FIELD OF THE INVENTION

The present invention relates to a dry etching method for use in manufacturing a semiconductor device; and, more particularly, to a dry etching method for forming a trench of a desired profile by etching a single crystalline silicon in shallow trench isolation (STI).

BACKGROUND OF THE INVENTION

Recently, a so-called shallow trench isolation (STI) is widely employed as a device isolation technique in the field of manufacture of semiconductor devices.

The STI process involves the steps of forming a trench in Si of a silicon substrate by dry etching; filling the trench with an insulating material such as $SiO_2$ by CVD; and finally performing planarization by, for example, CMP.

The STI requires a trench etching process for forming a trench in single crystalline silicon by anisotropic etching. Prior to such a trench etching process, a thermal oxide layer made of $SiO_2$ or the like and, for example, a silicon nitride (SiN) layer are formed on a surface of the silicon substrate made of Si; and a resist pattern is formed by employing a conventionally-used photolithography technique; and then the SiN layer and the thermal oxide layer are patterned by employing the resist pattern as a mask.

Subsequently, the resist pattern is removed, and then the trench etching process is executed by using the SiN layer and the thermal oxide layer as a mask to dry-etch an opening of the mask anisotropically.

Such a trench etching process is conventionally conducted by, for example, plasma etching, which employs as an etching gas, $Cl_2$, a mixture gas of $Cl_2+O_2$, a mixture gas of $Cl_2+HBr$, a mixture gas of $Cl_2+HBr+O_2$, or the like.

In the STI described above, the trench formed in the single crystalline silicon needs to be filled with a dielectric material, e.g., $SiO_2$ or the like. To facilitate a secure filling process, the trench is usually formed to be tapered with a predetermined angle so that a sidewall of the trench is gradually widens from a bottom portion toward an upper opening thereof.

However, a sidewall profile of a trench tends to be varied locally even within a single wafer, e.g., depending on whether the trench is located at a central portion or a peripheral portion thereof, or depending on a width of the trench. Therefore, it is difficult to uniformly form all trenches to have a desired sidewall profile.

Further, as the integration density of semiconductor devices is rapidly increased recently, an ever increasing demand for miniaturization of various devices formed on the silicon substrate becomes one of the most challenging technical requirements to be met. As the miniaturization further progresses, an etching area also becomes getting smaller when performing an etching in the STI process as described above. As a result, the processed portion formed on the silicon substrate is likely to be sharply edged and the width of the trench formed for the device isolation is also further reduced. Consequently, it becomes difficult to fill the trench with the insulating material. For this reason, it is essential to develop a trench profile facilitating the filling of the insulating material into the trench as the miniaturization of various devices further progresses.

By forming the trench with a profile adequate for facilitating the filling of the insulating material, a device isolation efficiency will improve, while preventing the occurrence of a leakage current or a post-filling stress. As for a trench profile, it is preferable that a bottom portion of the trench is of a shape as round as possible than edged. Furthermore, it is also preferable that a boundary portion between Si and a mask made of the SiN layer and the thermal oxide layer on the sidewall of the trench is formed in a round shape.

Conventionally, however, it has been very hard to round the bottom portion of the trench and the boundary portion between Si and the mask on the sidewall of the trench because the trench is formed in a single plasma processing employing a process gas such as $Cl_2$, as explained above.

SUMMARY OF THE INVENTION

It is, therefore, an object of the present invention to provide a dry etching method for forming trenches of a desired sidewall profile capable of facilitating the filling of an insulating material into the trenches even in case the trenches are of different widths.

In accordance with the present invention, there is provided a dry etching method for forming trenches of desired profiles in single crystalline silicon through a mask layer, the method including the steps of: employing an etching apparatus in which a substrate is loaded on either one of a pair of electrodes disposed in an etching chamber and facing each other and high frequency powers are supplied to both of the electrodes to thereby execute plasma etching; introducing an etching gas into the etching chamber; and controlling sidewall profiles of the trenches by adjusting a high frequency power applied to the electrode on which the substrate is mounted.

Further, the etching gas is a mixture gas including at least a gas containing Cl and a gas containing Br.

Further, the gas containing Cl is $Cl_2$.

Furthermore, the gas containing Br is HBr.

Still further, the etching gas includes oxygen.

Moreover, the sidewall profiles of the trenches are controlled by adjusting a total flow rate of the etching gas.

Further, the sidewall profiles of the trenches are controlled by adjusting an amount of $Cl_2$ contained in the etching gas.

Furthermore, the high frequency power applied to the electrode on which the substrate is mounted ranges from 0.157 to 1.57 $W/cm^2$.

Still further, the trenches formed on the substrate include trenches of different trench widths.

In accordance with the present invention, there is further provided a dry etching method for forming a trench on a silicon substrate by plasma processing silicon of the silicon substrate by way of introducing a process gas into an airtight processing chamber, the method including: a first process for conducting a plasma processing by introducing a mixture gas at least containing HBr and $N_2$ as the process gas; a second process for conducting a plasma processing to form the trench in the silicon of the silicon substrate; and a third process for conducting a plasma processing by introducing a mixture gas containing at least HBr and $Cl_2$ as the process gas.

Further, the first process is conducted under a condition where the pressure within the processing chamber is at most not greater than 6.7 Pa (50 mTorr; a ratio of a flow rate of HBr to a flow rate of $N_2$ among the process gas is equal to or greater than 3; and a bias high frequency power applied to an electrode provided in the processing chamber to generate plasma is 100 W or larger.

Furthermore, the third process is conducted under a condition where the pressure within the processing chamber is at least 20 Pa (150 mTorr) or greater; a ratio of a flow rate of HBr to a flow rate of $Cl_2$ among the process gas is equal to or greater than 2; and a bias high frequency power applied to an electrode provided in the process chamber to generate plasma is 50 W or larger.

Moreover, a time period during which the plasma processing is conducted in the first process is shorter than a time period during which the plasma processing is conducted in the second process.

Still further, a ratio of the time period during which the plasma processing is conducted in the second process to the time period during which the plasma processing is conducted in the first process is 1 to 0.15~0.5.

Still further, a time period during which the plasma processing is conducted in the third process is shorter than a time period during which the plasma processing is conducted in the second process.

Moreover, if a ratio of the time period during which the plasma processing is conducted in the second process to the time period during which the plasma processing is conducted in the third process is 1 to 0.3~0.7.

In accordance with the present invention, there is further provided a dry etching method for forming a trench on a silicon substrate by plasma processing silicon of the silicon substrate by way of introducing a process gas into an airtight processing chamber, the method including: a process performing an etching to round a boundary between an etching mask and the silicon on a sidewall of the trench before conducting a process for forming the trench in the silicon of the silicon substrate; and process performing an etching to round a bottom portion of the trench after the completion of the process for forming the trench in the silicon of the silicon substrate.

DETAILED DESCRIPTION OF THE PREFERRED EMBODIMENTS

Figure 1A:
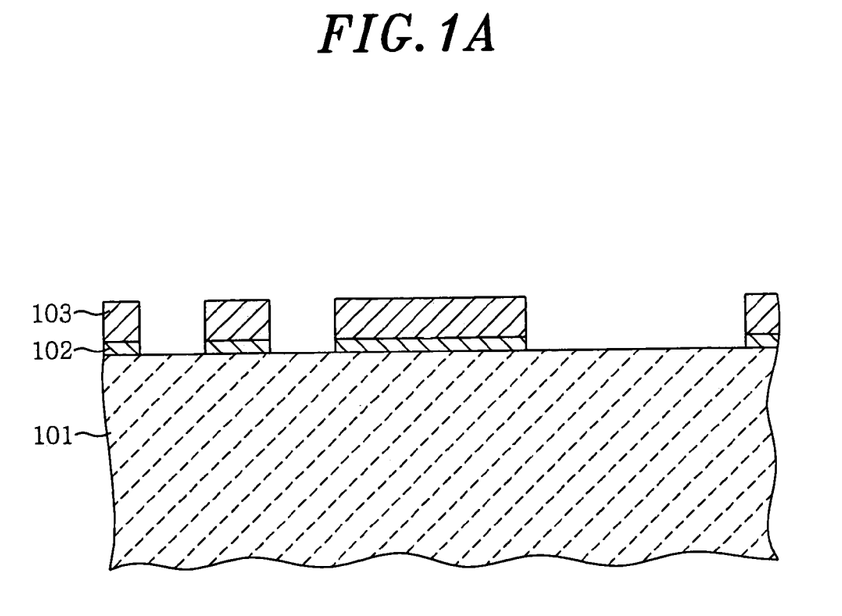
FIGS. 1A and 1B provide schematic cross sectional views of a wafer for explaining a preferred embodiment of the present invention.
Figure 1B:
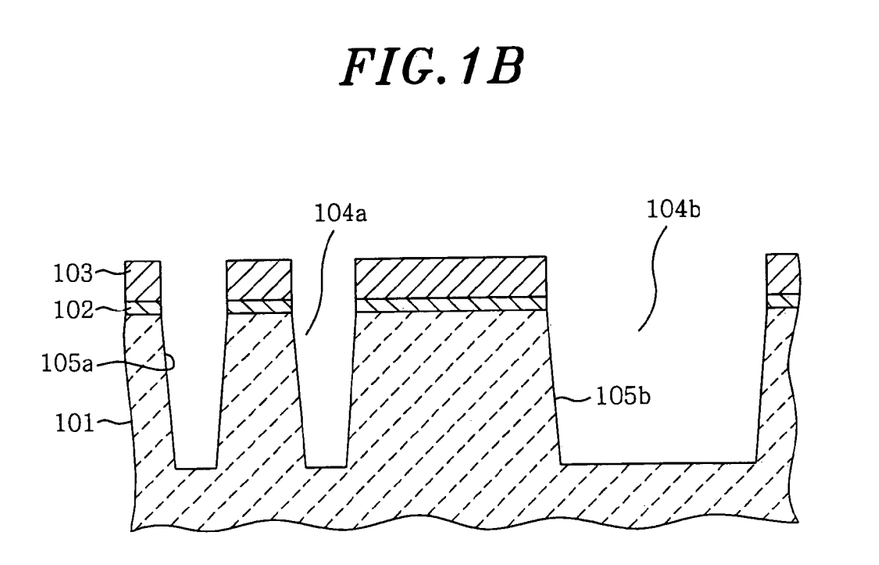

Preferred embodiments of the present invention will now be described with reference to the accompanying drawings. Referring to FIGS. 1A and 1B, there are illustrated partially enlarged schematic longitudinal cross sectional views of a semiconductor wafer (a silicon substrate) for explaining a first preferred embodiment of the present invention.

As shown in FIG. 1A, formed on a semiconductor wafer (a silicon substrate) 101 are a silicon dioxide layer 102 of a thickness of, e.g., about 9 nm and a silicon nitride layer 103 of a thickness of, e.g., 160 nm. The two layers 102 and 103 form a so-called hard mask which is patterned to have openings for use in forming trenches.

In the preferred embodiment, the semiconductor wafer 101 made of single crystalline silicon is etched through the hard mask made of the silicon nitride layer 103 and the like by plasma etching employing an etching gas containing at least $Cl_2$ and HBr, so that trenches 104a and 104b are formed in the semiconductor wafer 101 as shown in FIG. 1B.

The trenches 104a and 104b are formed to have respectively predetermined widths. The trench 104a illustrated in a left side of the drawing has a width of, e.g., 0.24 μm while the trench 104b shown in a right side of the drawing has a width of, e.g., 1.00 μm. Further, sidewalls 105a and 105b of the trenches 104a and 104b respectively have substantially identical taper angle and depth.

Figure 2:
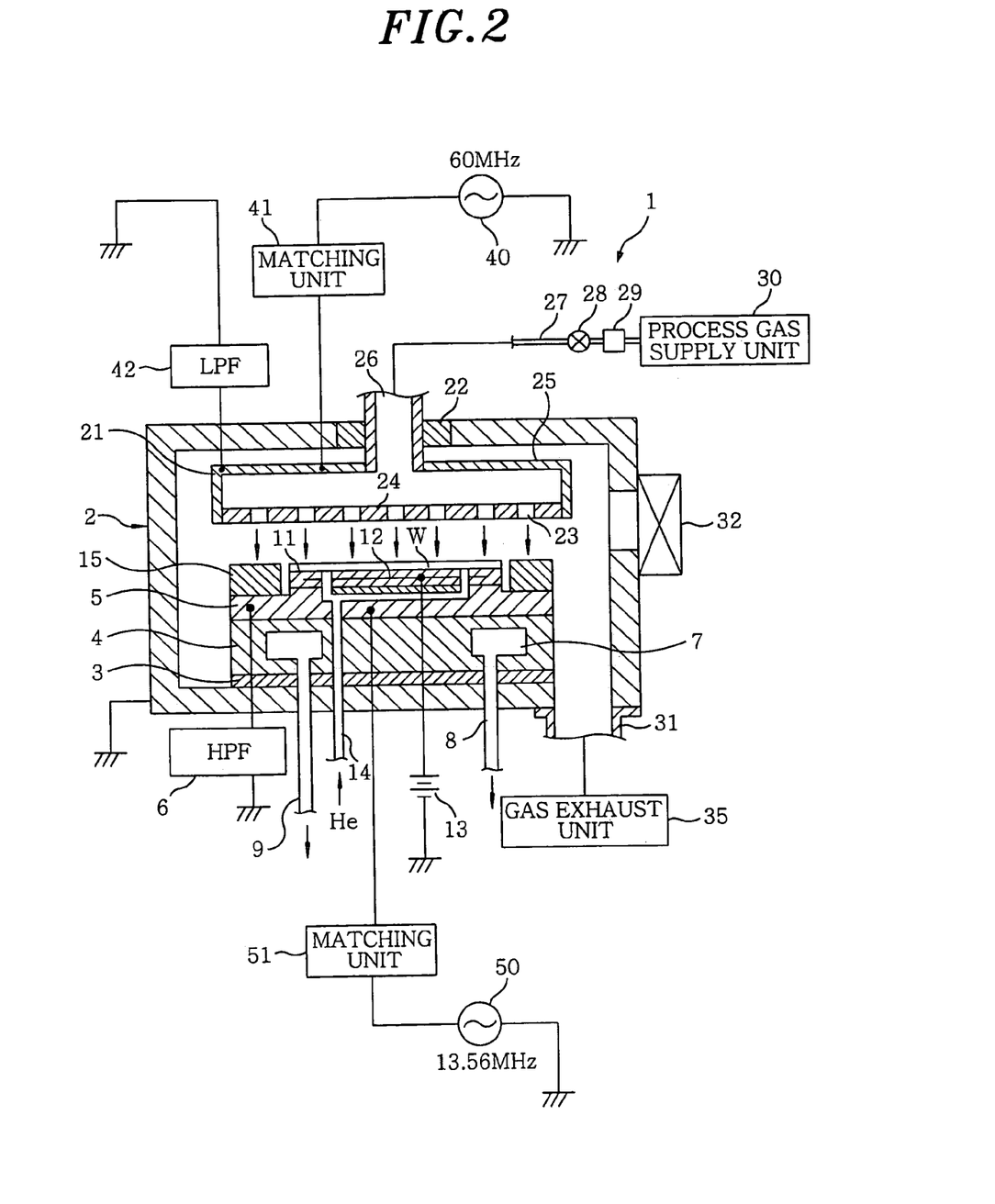
FIG. 2 illustrates an apparatus for use in the preferred embodiment of the present invention.

FIG. 2 schematically illustrates an exemplary configuration of a plasma processing apparatus for use in the preferred embodiment of the present invention. As shown therein, the plasma processing apparatus 1 is a capacitively coupled parallel plate type etching apparatus having upper and lower electrode plates placed to face each other in parallel and respectively connected to high frequency power supplies.

The etching apparatus 1 includes, for example, a cylindrical chamber 2 which is grounded and made of aluminum whose surface is alumite treated (anodization). Installed on a bottom portion of the chamber 2 via an insulating plate 3 is a substantially columnar susceptor support 4 for mounting thereon a wafer W. Mounted on the susceptor support 4 is a susceptor 5 serving as a lower electrode. Connected to the susceptor 5 is a high pass filter (HPF) 6. Prepared within the susceptor support 4 is a temperature control medium path 7. A temperature control medium is introduced into the temperature control medium path 7 via an inlet line 8 to circulate therethrough and is exhausted via an outlet line 9, so that the temperature of the susceptor 5 is maintained at a desired level. The susceptor 5 is of a circular disk shape with a central topmost portion being protruded. Mounted on the central topmost portion of the susceptor 5 is an electrostatic chuck 11 shaped substantially similar to the wafer W. The electrostatic chuck 11 includes an electrode 12 embedded in an insulating material. The electrostatic chuck 11 adsorbs the wafer W electrostatically by a Coulombic force generated by, e.g., a DC voltage of 1.5 kV supplied from a DC power supply 13 coupled to the electrode 12. Further, formed through the insulating plate 3, the susceptor support 4, the susceptor 5 and the electrostatic chuck 11 is a gas channel 14 for supplying a heat transfer medium, e.g., He gas or the like, to a backside of the wafer W to be processed. Heat is transferred between the susceptor 5 and the wafer W through the heat transfer medium, so that the wafer W is maintained at a predetermined temperature.

An annular ring-shaped focus ring 15 is disposed on an upper peripheral portion of the susceptor 5 to surround the wafer W mounted on the electrostatic chuck 11. The focus ring 15 is made of an insulating material such as ceramic, quartz, or the like, and serves to improve etching uniformity.

Further, installed above the susceptor 5 in a manner of facing the susceptor 5 in parallel is an upper electrode 21 which is supported within the chamber 2 via an insulating member 22. The upper electrode 21 includes an electrode plate 24 (made of, for example, quartz) provided with a plurality of injection openings 23 and an electrode support 25 that serves to support the electrode plate 24 (made of a conductive material, for example, aluminum whose surface is alumite treated). The distance between the susceptor 5 and the upper electrode 21 is adjustable.

Formed at a center of the electrode support 25 of the upper electrode 21 is a gas inlet opening 26 connected to a gas supply line 27, which in turn is connected to a process gas supply unit 30 via a valve 28 and a mass flow controller 29. An etching gas for plasma etching is supplied from the process gas supply unit 30. Though there is shown in FIG. 2 only one process gas supplying system comprised of the process gas supply unit 30, and the like, the plasma processing apparatus is provided with a plurality of process gas supplying systems capable of supplying HBr gas, $Cl_2$ gas, $O_2$ gas, $N_2$ gas, and the like, into the chamber 2 by individually controlling flow rates thereof.

Connected to a bottom portion of the chamber 2 is a gas exhaust line 31, which in turn is coupled to a gas exhaust unit 35. The gas exhaust unit 35 includes a vacuum pump such as a turbo molecular pump or the like, and serves to reduce an inner pressure of the chamber 2 down to a predetermined vacuum level, e.g., 1 Pa (7.5 mTorr) or less. Further, installed on a sidewall of the chamber 2 is a gate valve 32. The wafer W is transferred between the chamber 2 and an adjacent load lock chamber (not shown) while the gate valve is open.

Connected to the upper electrode 21 via a matching unit 41 is a first high frequency power supply 40. Further connected to the upper electrode 21 is a low pass filter (LPF) 42. The first high frequency power supply 40 has a frequency ranging from 50 to 150 MHz. By applying such a high frequency, a high-density plasma in a desired dissociation state can be generated within the chamber 2, which makes it possible to execute a plasma process under a pressure lower than that in conventional cases. The range of the frequency of the first high frequency power supply 40 is preferably from 50 to 80 MHz. Typically, its frequency is 60 MHz as illustrated in FIG. 2 or thereabouts.

Connected via a matching unit 51 to the susceptor 5 serving as the lower electrode is a second high frequency power supply 50. A frequency of the second high frequency power supply 50 ranges from several hundred Hz to less than twenty MHz. By applying a frequency in such a range, a proper ionic action can be exerted on the wafer to be processed without causing any damage. Typically, the frequency of the second high frequency power supply 50 is, e.g., 13.56 MHz as shown in FIG. 2, or 800 MHz.

In the following, there will be explained a process for etching a wafer W made of single crystalline silicon to form trenches therein by employing the plasma processing apparatus 1 configured as described above.

First, the gate valve 32 is opened and then the wafer W, on which a mask layer is formed of the silicon oxide layer 102 and the silicon nitride layer 103, is carried into the chamber 2 from the load lock chamber (not shown) to be mounted on the electrostatic chuck 11. A DC voltage is then supplied from the DC power supply 13 to the electrostatic chuck 11, so that the wafer W is adsorbed thereto electrostatically.

Then, the gate valve 32 is closed and the chamber 2 is evacuated to a predetermined vacuum level by the gas exhaust unit 35. Then, the valve 28 is opened, and an etching gas for a main etching (for example, $HBr+Cl_2$ or $HBr+Cl_2+O_2$) is supplied from the process gas supply unit 30 onto the wafer W. The etching gas, a flow rate of which is controlled by the mass flow controller 29, is discharged uniformly towards the wafer W as indicated by arrows in FIG. 2 via the process gas supply line 27, the gas inlet opening 26, a hollow central space of the upper electrode 21 and the injection openings 23 of the electrode plate 24.

At the same time, the inner pressure of the chamber 2 is maintained at a predetermined pressure level of, e.g., about 13 Pa (100 mTorr). Thereafter, by supplying high frequency powers to the upper electrode 21 and the susceptor 5 (the lower electrode) from the first and the second high frequency power supply 40 and 50, respectively, the etching gas is converted into a plasma to thereby perform the etching of the wafer W.

Figure 3:
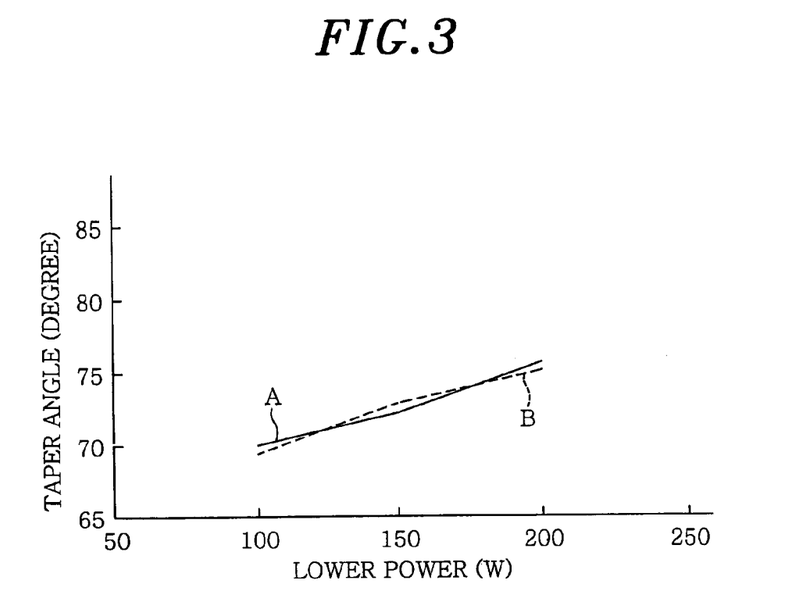
FIG. 3 is a graph describing a relationship between a lower power and a taper angle of a trench having a width of 0.24 μm.
Figure 4:
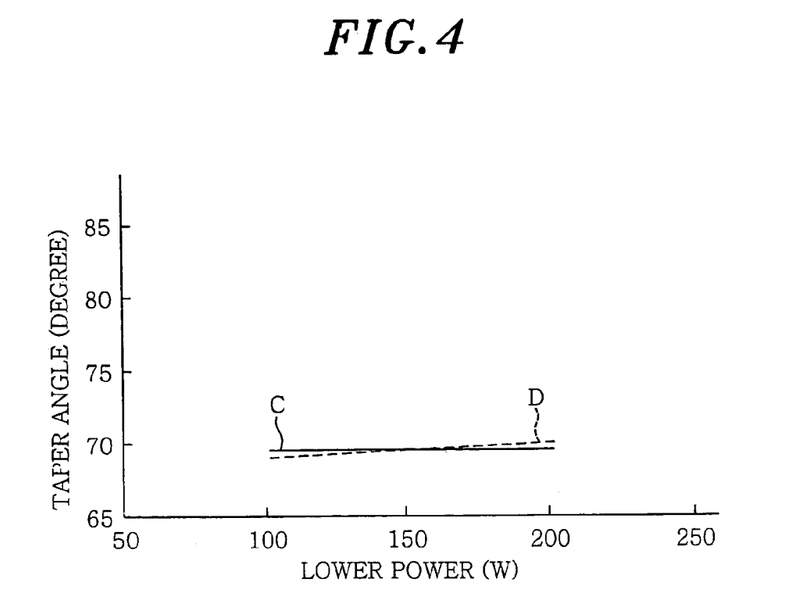
FIG. 4 provides a graph showing a relationship between a lower power and a taper angle of a trench having a width of 1.00 μm.

FIGS. 3 and 4 provide graphs showing a relationship between a high frequency power supplied from the second high frequency power supply 50 to the susceptor 5 serving as the lower electrode and a taper angle of a sidewall of a trench in case of etching a wafer W having an 8 inch diameter by employing the etching apparatus 1 configured as described above, wherein a vertical axis represents the taper angle while a horizontal axis stands for a lower power (a power supplied to the lower electrode) in each graph. FIG. 3 explains a case of a trench having a width of 0.24 μm, while FIG. 4 describes a case of a trench having a width of 1.00 μm.

In FIGS. 3 and 4, solid lines A and C define taper angles of trenches formed at a central portion of the wafer W while dashed lines B and D indicate taper angles of trenches formed at a peripheral portion of the wafer W.

Further, the etching condition is as follows:
an etching gas: $Cl_2$ (a flow rate of 15 sccm)+HBr (a flow rate of 285 sccm)+$O_2$ (a flow rate of 2.5 sccm)
a pressure: 13 Pa (100 mTorr)
a high frequency power applied to the upper electrode: 1000 w
a distance between the electrodes: 80 mm
a pressure of He backgas (center/edge): 400/400 Pa (3 Torr)
a chamber temperature (top/bottom/wall): 60/60/50°0 C.
an etching time: 47 seconds.

As can be seen from the graph in FIG. 3, in case of the trench 104a having the narrower width of 0.24 μm, the taper angle has a tendency to increase linearly as the lower power increases. On the other hand, in case of the trench 104b having the wider width of 1.00 μm, the taper angle is rarely changed even though the lower power is varied, as can be seen from the graph in FIG. 4.

Therefore, in the example provided in FIGS. 3 and 4, the trench 104a of the narrower width and the trench 104b of the wider width can be controlled to have a substantially same taper angle by applying a lower power of 100 W (0.314 W/cm$^2$).

Figure 5:
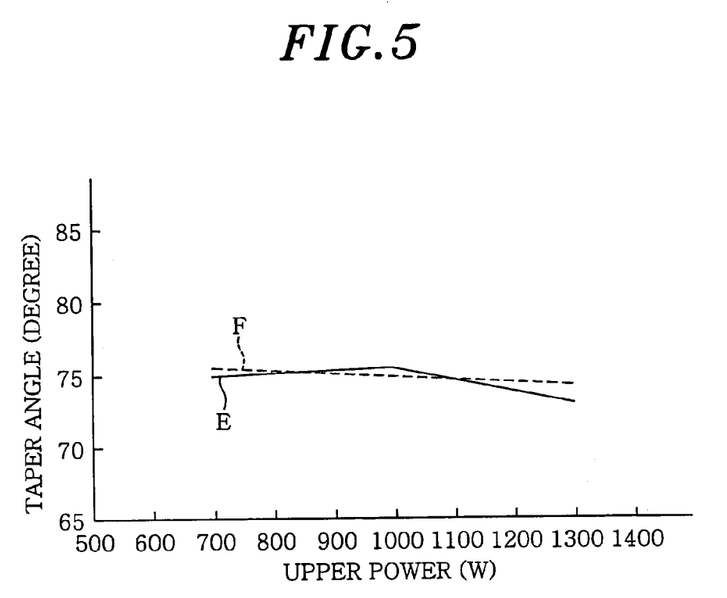
FIG. 5 depicts a graph explaining a relationship between an upper power and a taper angle of the trench having the width of 0.24 μm.
Figure 6:
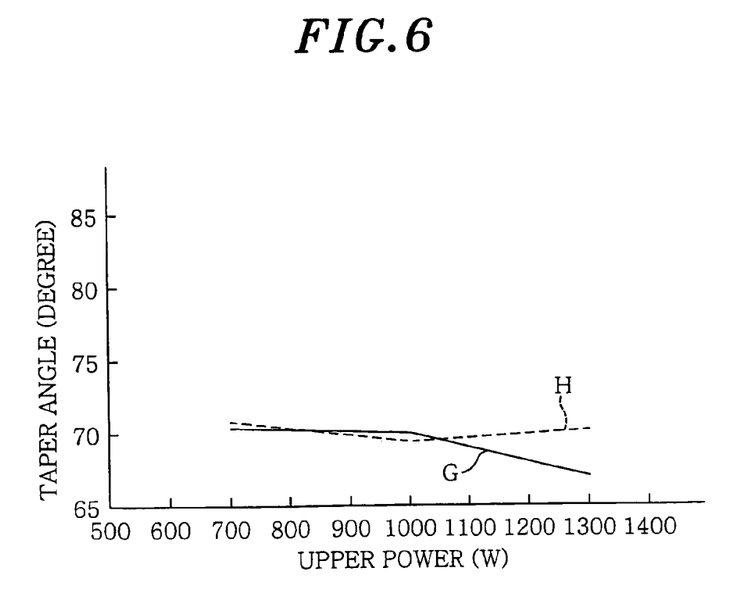
FIG. 6 sets forth a graph illustrating a relationship between an upper power and a taper angle of the trench having the width of 1.00 μm.

Further, FIGS. 5 and 6 provide graphs describing a relationship between a high frequency power supplied to the upper electrode 21 from the first high frequency power supply 40 and a taper angle of a sidewall of a trench in the case of etching the wafer W having the 8 inch diameter by employing the etching apparatus 1 configured described above, wherein a vertical axis represents the taper angle while a horizontal axis stands for an upper power (a power supplied to the upper electrode) in each graph. FIG. 5 describes the case of the trench of the width of 0.24 μm, while FIG. 6 explains the case of the trench of the width of 1.00 μm.

In FIGS. 5 and 6, solid lines E and G indicate taper angles of trenches formed at the central portion of the wafer W, while dashed lines F and H represent taper angles of trenches formed at the peripheral portion of the wafer W.

As can be seen from the graphs of FIGS. 5 and 6, the taper angles of the trenches are rarely changed even though the upper power is varied. Thus, it is more effective to adjust the lower power rather than the upper power for the control of the taper angle.

Further, if the lower power is excessively large, an etching rate is increased and, at the same time, the selectivity against the mask layer of the silicon nitride and the like is reduced. Thus, it is preferable to set the lower power not to exceed about 500 W. Furthermore, since the etching rate is reduced if the lower power is far below 100 W, specifically less than 50 W, it is preferred to set the lower power in the range from about 50 W to about 500 W for the wafer W having the diameter of 8 inches. In other word, a lower power per unit area is preferably set to be within a range from 0.157 to 1.57 W/cm$^2$.

Figure 7:
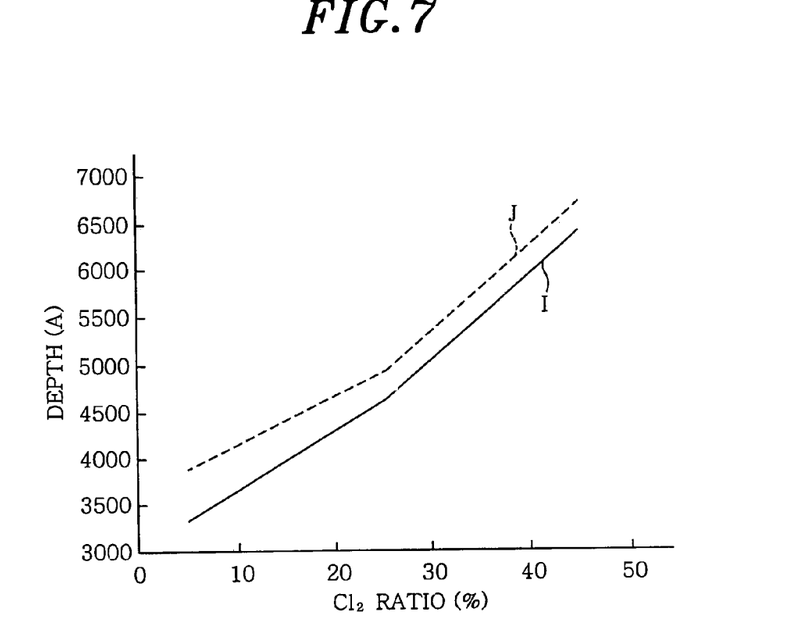
FIG. 7 is a graph describing a relationship between an etching depth and a $Cl_2$ ratio.

FIG. 7 is a graph explaining a relationship between a depth of etching (thus, substantially, an etching rate) and a Cl$_2$ ratio in the etching gas (a flow rate of Cl$_2$/a total flow rate of etching gas) in the case of etching the wafer W having the diameter of 8 inches by employing the etching apparatus 1 described above. In FIG. 7, a vertical axis represents the etching depth while a horizontal axis stands for the Cl$_2$ ratio; and a solid line I describes the case of the trench of the width of 0.24 μm while a dashed line J explains the case of the trench of the width of 1.00 μm.

Figure 8:
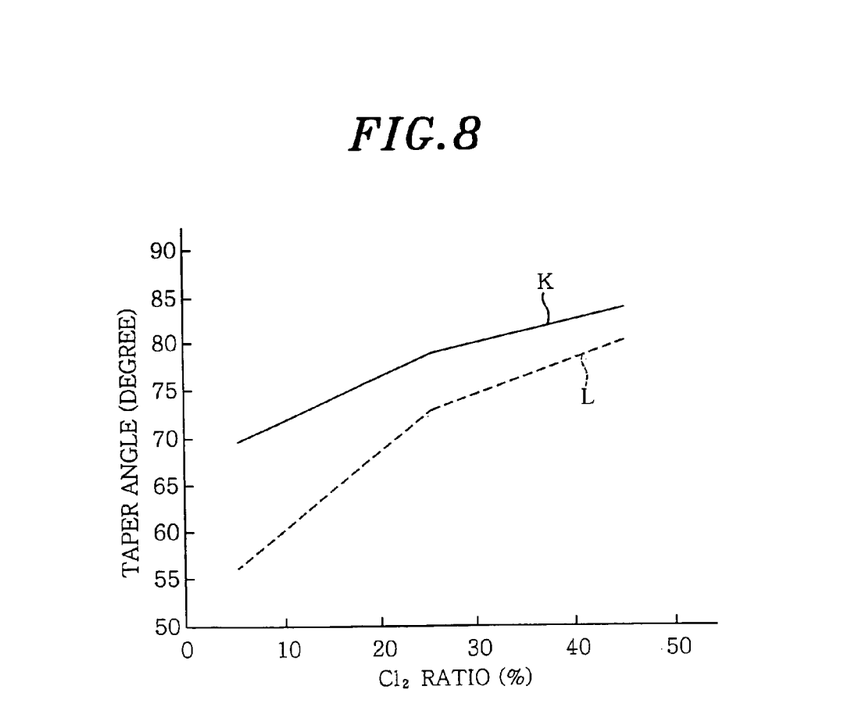
FIG. 8 provides a graph indicating a relationship between a taper angle and a $Cl_2$ ratio.

FIG. 8 sets forth a graph explaining a relationship between a taper angle and a Cl$_2$ ratio in the etching gas (a flow rate of Cl$_2$/a total flow rate of etching gas) in case of etching the wafer W having the diameter of 8 inches by using the etching apparatus 1 described above. In FIG. 8, a vertical axis represents the taper angle while a horizontal axis stands for the Cl$_2$ ratio; and a solid line K describes the case of the trench with the width of 0.24 μm while a dashed line L explains the case of the trench with the width of 1.00 μm.

The etching condition is as follows:
an etching gas: Cl$_2$ +HBr (a sum of flow rates thereof is 200 sccm)
O$_2$ added (a flow rate of 1.6 sccm)
a pressure: 13 Pa (100 mTorr)
a high frequency power applied to the upper electrode: 1000 W
a high frequency power applied to the lower electrode: 200 W
a distance between the electrodes: 80 mm
a pressure of He backgas (center/edge): 400/400 Pa (3 Torr)
a chamber temperature (top/bottom/wall): 60/60/50° C.
an etching time: 83 seconds.

As can be seen from graphs in FIGS. 7 and 8, the etching rate and the taper angle are changed by varying the Cl$_2$ ratio in the etching gas. Further, as shown in FIG. 8, a variation of the taper angle is not identical in the two cases where the trench width is 0.24 μm (the solid line K) and 1.00 μm (a dashed line L), respectively.

Accordingly, in case of changing, for example, the Cl$_2$ ratio in the etching gas in order to obtain a desired etching rate and a desired taper angle, it is highly likely that taper angles of a trench of a smaller width and a trench of a larger width become different. In such a case, the difference in the taper angles can be eliminated by adjusting the lower power, as described above. That is, if the taper angle of the narrower trench is smaller than that of the wider trench, the lower power is increased. Conversely, if the taper angle of the narrower trench is larger than that of the wider trench, the lower power is reduced.

Figure 9:
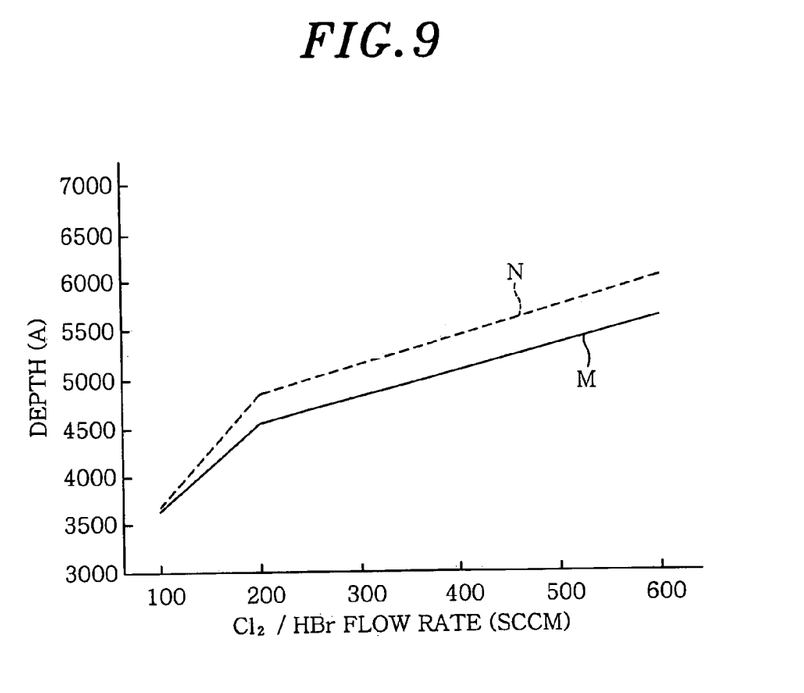
FIG. 9 depicts a graph illustrating a relationship between an etching depth and a total flow rate of an etching gas.
Figure 10:
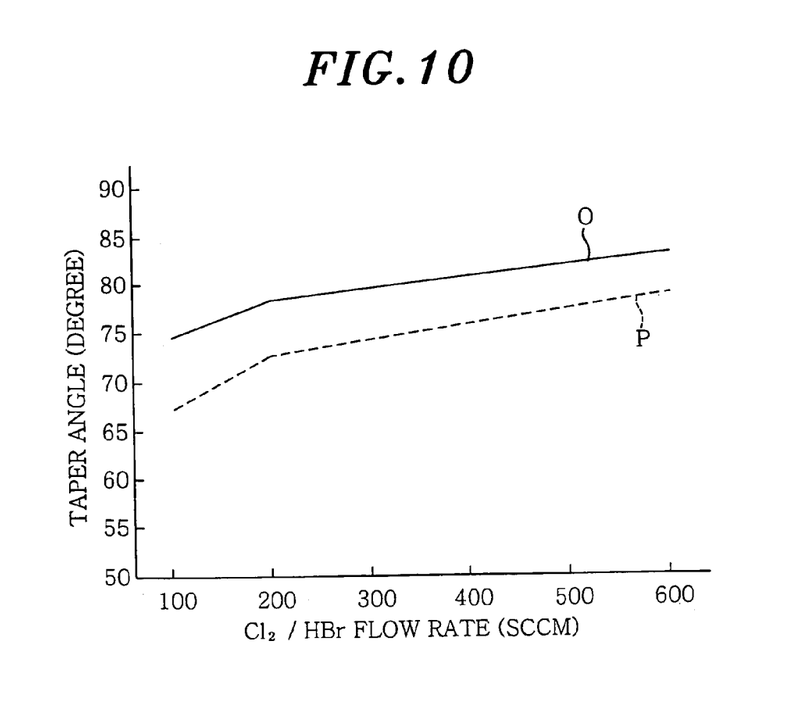
FIG. 10 sets forth a graph explaining a relationship between a taper angle and a total flow rate of an etching gas.

FIG. 9 is a graph describing a relationship between an etching depth (thus, substantially, an etching rate) and a total flow rate of the etching gas in case of etching the wafer W having the diameter of 8 inches by employing the etching apparatus 1 described above. In FIG. 9, a vertical axis represents the etching depth while a horizontal axis stands for the total flow rate of the etching gas; and a solid line M describes the case of the trench of the width of 0.24 μm while a dashed line N explains the case of the trench of the width of 1.00 μm. Further, FIG. 10 depicts a graph showing a relationship between a taper angle and a total flow rate of the etching gas in the case of etching the wafer W having the diameter of 8 inches by using the etching apparatus 1 described above. In FIG. 10, a vertical axis represents the taper angle while a horizontal axis stands for the total flow rate of the etching gas; and a solid line O describes the case of the trench having the width of 0.24 μm while a dashed line P explains the case of the trench having the width of 1.00 μm.

Further, the etching condition is as follows:
an etching gas: Cl$_2$+HBr+O$_2$
Cl$_2$=25% (of the sum of flow rates of Cl$_2$ and HBr)
O$_2$=0.8% (of the sum of the flow rates of Cl$_2$ and HBr)
a pressure: 13 Pa (100 mTorr)
a high frequency power applied to the upper electrode: 1000 W
a high frequency power applied to the lower electrode: 200 W
a distance between the electrodes: 80 mm
a pressure of He backgas (center/edge): 400/400 Pa (3 Torr)
a chamber temperature (top/bottom/wall): 60/60/50° C.
an etching time: 83 seconds.

As shown in FIGS. 9 and 10, the etching rate and the taper angle are changed by varying the total flow rate of the etching gas. Further, as can be seen from the graph in FIG. 10, a variation of the taper angle is different in the two cases where the trench width is 0.24 μm (the solid line O) and 1.00 μm (the dashed line P), respectively.

Accordingly, in case of changing, for example, the total flow rate of the etching gas in order to obtain a desired etching rate and a desired taper angle, it is highly likely that a trench of a smaller width and a trench of a larger width will have different taper angles. In such a case, the difference in the taper angles can be removed by adjusting the lower power, as described above. That is, if the taper angle of the narrower trench is smaller than that of the wider trench, the lower power is increased. Conversely, if the taper angle of the narrower trench is larger than that of the wider trench, the lower power is reduced.

In the dry etching method in accordance with the preferred embodiment as described above, sidewalls of trenches can be controlled to have a predetermined profile with a desired taper angle by controlling the lower power together with the total flow rate of the etching gas, the $Cl_2$ amount (ratio) among the etching gas, and so on, even if there exist trenches having different trench widths.

Accordingly, the subsequent work of filling the dielectric material into the trenches can be performed efficiently, thereby facilitating the proper device isolation by STI.

In the following, there will be explained a process for etching Si in the STI process in accordance with another preferred embodiment of the present invention with reference to FIGS. 11A to 11D, which explain a process for forming trenches to be filled with an insulating material such as $SiO_2$ for the device isolation in the STI process.

Figure 11A:
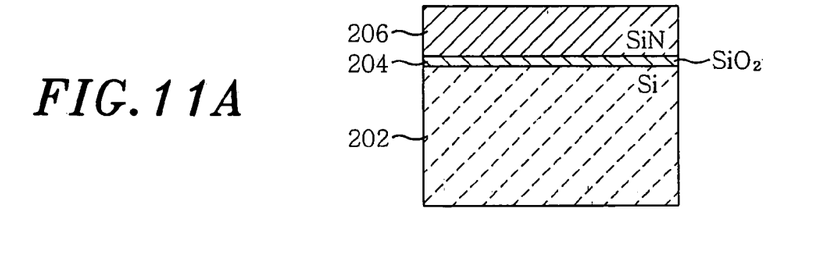
FIGS. 11A to 11D provide schematic cross sectional views of a wafer for explaining another preferred embodiment of the present invention.

First, as shown in FIG. 11A, a thermal oxide layer 204 such as silicon oxide ($SiO_2$) of a thickness of about 10 nm and a silicon nitride (SiN) layer 206 are formed on a silicon substrate 202 made of Si. Thereafter, a resist pattern is formed by a conventional photolithography technique and then the SiN layer 206 and the thermal oxide layer 204 are patterned by employing the resist pattern as a mask. Thereafter, the resist pattern is removed by ashing a residual photoresist layer.

Subsequently, by employing the SiN layer 206 and the thermal oxide layer 204 as a mask, an opening thereof is dry etched anisotropically, thereby forming a trench to be filled with an insulating material for the device isolation.

In this preferred embodiment, prior to a main process (a second process) for conducting a plasma processing by using, e.g., a mixture gas of $Cl_2$ and $O_2$, there is performed a pre-process (a first process) for rounding a boundary between the mask and Si on a sidewall of the trench. Further, after the main etching (the second process), a post-process (a third process) for rounding a bottom portion of the trench is executed.

The pre-process involves the step of plasma-etching Si through the mask of the SiN layer 206 and the thermal oxide layer 204 by employing a mixture gas containing HBr and $N_2$ as a process gas.

At this time, the plasma processing is preferably conducted under the following condition: the inner pressure of the chamber 2 is maintained at a predetermined level adequate for producing enough reaction products (deposits) to facilitate rounding process of the shape, specifically 6.7 Pa (50 mTorr) or less and more preferably in practical point of view between 2.7 Pa (20 mTorr) and 6.7 Pa (50 mTorr) inclusive; a ratio of flow rates of HBr and $N_2$ is determined at a level adequate for keeping the etching process going, specifically a ratio of the flow rate of HBr to that of $N_2$ being 3 or larger; and a bias high frequency power applied to the susceptor 5 serving as the lower electrode is set to a level high enough to sustain the etching without stopping, specifically 100 W or greater, preferably 150 W or larger and more preferably 200 W or larger.

Figure 11B:
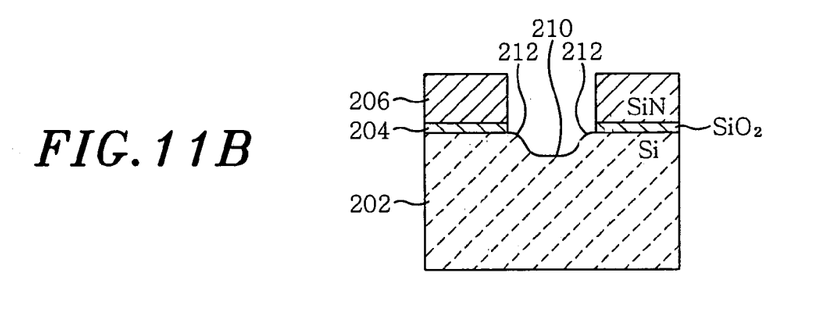

With the etching by the plasma processing in such a pre-process, a shallow trench 210 having a round sidewall is formed in Si, as shown in FIG. 11B. If the main process etching is conducted in this state, an upper part of the sidewall of the trench 210, i.e., a boundary 212 between the mask layer and Si gets rounded, as shown in FIG. 11C.

The etching is conducted by the main process of plasma processing. The main process involves the step of anisotropically etching Si through the mask of the SiN layer 206 and the thermal oxide layer 204 by plasma processing employing a mixture gas containing $Cl_2$ and $O_2$, as in a conventional case. The condition for such a main etching process is identical to that of the conventional case.

Specifically, in case of executing the etching by employing the mixture gas containing $Cl_2$ and $O_2$ as the etching gas, for example, an inner pressure of the chamber 2 was 2.7 Pa (20 mTorr); a high frequency power applied to the upper electrode 21 was 600 W; a high frequency power applied to the susceptor 5 serving as the lower electrode was 20 W; a distance between the upper electrode 21 and the susceptor 5 was 115 mm; a ratio of flow rates of $Cl_2$ and $O_2$ (a flow rate of $Cl_2$/a flow rate of $O_2$) employed as a process gas was 168 sccm/32 sccm; and the setting temperatures of the susceptor 5, the upper electrode 21 and the sidewall within the chamber 2 were 40° C., 80° C. and 60° C., respectively.

Figure 11C:
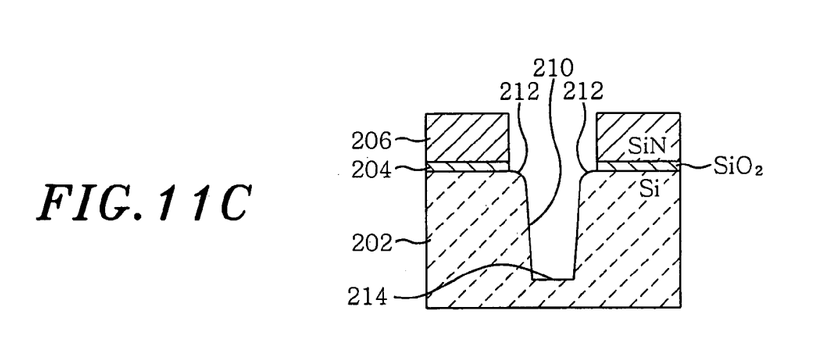

By conducting the plasma processing of such main process, a bottom portion 214 of the trench 210 is further etched deeply and there remains a rounded shape at the boundary between the mask layer and Si on the sidewall of the trench 210, as shown in FIG. 11C. Further, by setting the condition for the plasma processing of the main process as in the embodiment described above, the taper angle of the trench 210 can be controlled.

Subsequently, a plasma processing of the post-process is conducted. The post-process is performed to round the bottom portion 214 of the trench 210 since there still remain edged parts at the bottom portion 214 even after the completion of the pre-process and the main process.

In the post-process, Si is etched by the plasma processing through the mask of the SiN layer 206 and the thermal oxide layer 204 by employing a mixture gas containing $Cl_2$ and HBr. At this time, it is preferable to maintain the inner pressure of the chamber 2 at a level adequate for producing a large amount of deposits to facilitate the rounding. Specifically, the inner pressure of the chamber 2 is preferably 20 Pa (150 mTorr) or greater. A ratio of the flow rates of HBr and $Cl_2$ is preferably determined at a level for keeping the etching process going, and specifically a ratio of a flow rate of HBr to a flow rate of $Cl_2$ is preferably set to be 2 or more. A bias high frequency power applied to the susceptor 5 serving as the lower electrode is preferably set to a level high enough to sustain the etching process without stopping, specifically about 50 W or larger.

Figure 11D:
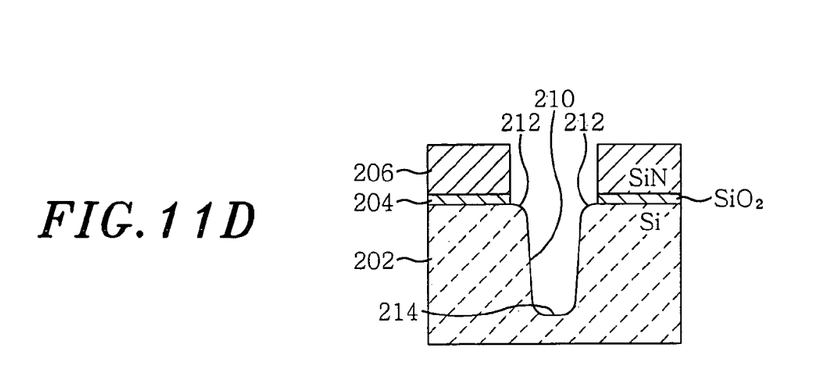

By conducting the plasma processing of the post-process, the bottom portion of the trench 210 is further etched deeply, and concurrently, there is formed a rounded shape as shown in FIG. 11D. As a result, the trench 210 formed in Si is formed to have a profile capable of facilitating the filling process of the trench with the insulating material.

The plasma processings of the pre-process and the post-process are performed for a time period shorter than that of the plasma processing of the main process. For example, if a time period set for the plasma processing of the main process is 1, the plasma processings in the pre-process and the post process are conducted for time periods corresponding to 0.15 to 0.5 and 0.3 to 0.7, respectively. Specifically, if the main process is conducted for, e.g., about 30 seconds, the pre-process and the post-process are performed for about 5 to 15 seconds and 10 to 20 seconds, respectively.

Accordingly, Si can be etched in the pre-process only as much as the boundary 212 between the mask and Si on the sidewall of the trench 210 is rounded and in the post-process only as much as the bottom portion 214 of the trench 210 is formed to have the round shape.

Figure 12:
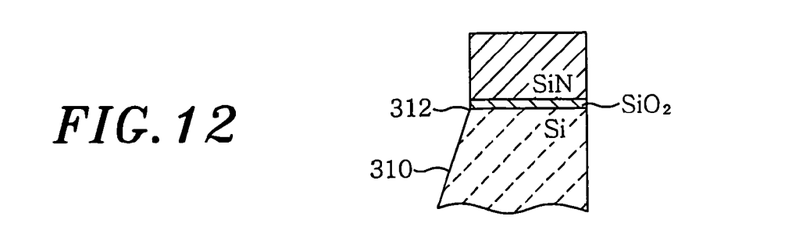
FIG. 12 is a schematic view of a part of a sidewall of a trench in case of performing a plasma processing in a conventional main process.

The profile of the trench formed by the etching process in accordance with the present invention will now be described in comparison with that of a conventional case. FIG. 12 shows a sidewall profile of a trench obtained by performing only the conventional main etching process, while FIG. 13 illustrates the sidewall profile of the trench obtained in the case of conducting the pre-process etching and the main process etching.

FIG. 12 shows the case resulted from performing the conventional main process as a plasma processing under the following condition: a mixture gas containing $Cl_2$ and $O_2$ was employed as a process gas; an inner pressure of the chamber 2 was 2.7 Pa (20 mTorr); a high frequency power applied to the upper electrode 21 was 600 W; a high frequency power applied to the susceptor 5 serving as the lower electrode was 200 W; a distance between the upper electrode 21 and the susceptor 5 was 115 mm; a ratio of flow rates of $Cl_2$ and $O_2$ (a flow rate of $Cl_2$ /a flow rate of $O_2$) employed as a process gas was about 168 sccm/32 sccm; and the setting temperatures of the susceptor 5, the upper electrode 21 and the sidewall within the chamber 2 were 40° C., 80° C. and 60° C., respectively.

Figure 13:
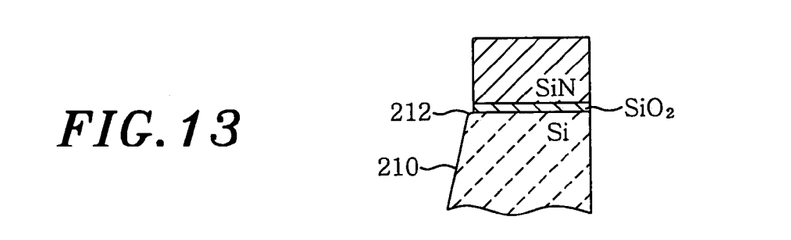
FIG. 13 shows a schematic view of a part of a sidewall of a trench in case of performing plasma processings in a pre-process (a first process) and a main process (a second process) in accordance with the preferred embodiments.

FIG. 13 describes the case resulted from performing the pre-process and the main process in accordance with the present invention. The plasma processing of the pre-process was performed under the condition as follows: an inner pressure of the chamber 2 was 2.7 Pa (20 mTorr); a high frequency power applied to the upper electrode 21 was 700 W; a high frequency power applied to the susceptor 5 serving as the lower electrode was 300 W; a distance between the upper electrode 21 and the susceptor 5 was 115 mm; a ratio of flow rates of HBr and $N_2$ process gases (a flow rate of HBr/a flow rate of $N_2$) employed as a process gas was 300 sccm/100 sccm; and the setting temperatures of the susceptor 5, the upper electrode 21 and the sidewall within the chamber 2 were 50° C., 60° C. and 60° C., respectively. The pre-process was conducted for a short time of about 5 to 15 seconds. The plasma processing of the main process was conducted for about 30 seconds under the same condition as described in the conventional main process.

The experimental results are as follows. In case of the case of performing etching only by the conventional main process, a boundary 312 between a mask (the SiN layer 206 and the thermal oxide layer 204) and Si on a sidewall of a trench 310 is linearly formed as shown in FIG. 12. On the other hand, in case of performing the pre-process and the main process in accordance with the present invention, the boundary 212 between the mask and Si on the sidewall of the trench 210 is rounded as illustrated in FIG. 13.

Figure 14:
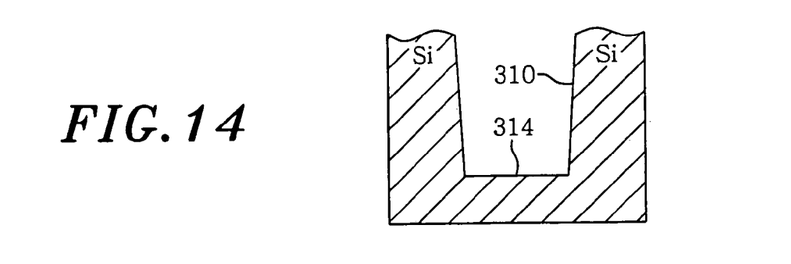
FIG. 14 sets forth a schematic view of a bottom portion of the trench in case of performing the plasma processing in the conventional main process; and, FIG. 15 demonstrates a schematic view of a bottom portion of the trench in case of performing the plasma processings by the main process (the second process) and the post-process (the third process) in accordance with the preferred embodiments.
Figure 15:
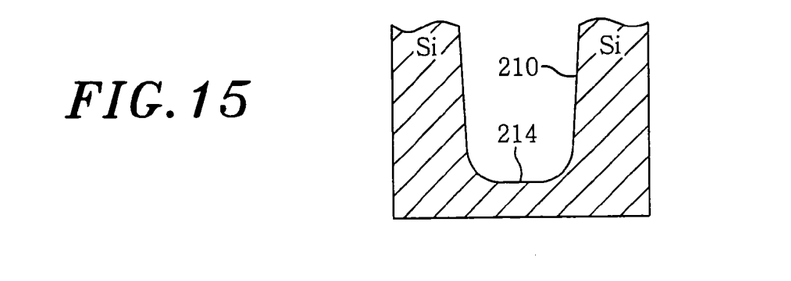

Profiles of bottom portions of the trenches formed by performing etching only by the conventional main process and by the post-process are illustrated in FIGS. 14 and 15, respectively.

FIG. 14 illustrates a shape of a bottom portion 314 of the trench 310 formed by performing etching by the conventional main process under the same condition as described in FIG. 12. FIG. 15 shows a result of performing the post-process etching in accordance with the present invention after conducting the same main process described in FIG. 13.

The plasma processing of the post-process was executed for a short period of about 10 to 20 seconds under the condition as follows: an inner pressure within the chamber 2 was set to be 20 Pa (150 mTorr); a high frequency power applied to the upper electrode 21 was 500 W; a high frequency power applied to the susceptor 5 functioning as the lower electrode was 500 W; a distance between the upper electrode 21 and the susceptor 5 was 140 mm; a ratio of flow rates of HBr and $Cl_2$ (a flow rate of HBr/a flow rate of $Cl_2$) serving as the process gas was 225 sccm/75 sccm; and the setting temperatures of the susceptor 5, the upper electrode 21 and the sidewall within the chamber 2 were 40° C., 80° C. and 60° C., respectively.

The experimental results are as follows. As can be seen in FIG. 14, there exist edged parts at the bottom portion 314 of the trench 310 formed in Si in the case of etching by the conventional main process. However, as shown in FIG. 15, the overall bottom portion 214 of the trench 210 in Si has a round shape and the edged parts are removed in the case of performing the post-process after the main process in accordance with the present invention.

In filling the conventional trench 310 with the insulating material such as $SiO_2$, e.g., by deposition, which is stacked on the surface of the trench 310 layer by layer, the conventional trench 310 having edged parts suffers from certain disadvantages in that there may be generated a leakage current due to an occurrence of stress or voids produced by the merging of the layers. However, in the case of the etching method of the present invention, it becomes easier to fill the insulating material into the trench 210 since the round shape is formed in the thus formed trench 210 with no edged parts. That is, isolation efficiency is improved, and the leakage current and the post-filling stress hardly occur.

In accordance with the embodiment described above, by performing the plasma processing (the pre-process: the first process) for a short time period by employing the process gas containing HBr and $N_2$ prior to the etching by the main process (the second process) and, further, by performing the plasma processing (the post-process: the third process) for another short time period by employing the process gas containing $Cl_2$ and HBr after the plasma processing by the main process when forming the trench 210 accommodating therein an insulating material for device isolation in Si of silicon substrate in the STI process, there can be obtained the trench 210 capable of facilitating the filling process thereof with the insulating material such as $SiO_2$. Specifically, as shown in FIG. 11D, a round shape is formed at the boundary 212 between the mask and Si on the sidewall of the trench 210 (the upper part of the sidewall of the trench 210) and at the same time a round shape is formed at the bottom portion 214 of the trench 210 without any edged parts.

Since it is possible to form the trench 210 of such a profile, the isolation efficiency is enhanced and the occurrence of the leakage current or the stress after the filling of the insulating material can be suppressed. Therefore, various devices can be further miniaturized. Furthermore, though the preferred embodiment has been described for the case of employing the plasma etching apparatus for supplying high frequency powers to both the upper electrode 21 and the susceptor 5 serving as the lower electrode, the present invention is not limited to the etching apparatus of this type. For example, the present invention can be applied to a plasma etching apparatus for supplying a high frequency power only to the lower electrode.

INDUSTRIAL APPLICABILITY

The dry etching method in accordance with the present invention can be employed in the semiconductor industry manufacturing semiconductor devices. Thus, it has an industrial applicability.

What is claimed is:

1. A dry etching method for forming a trench on a silicon substrate by plasma processing silicon of the silicon substrate by way of introducing a process gas into an airtight processing chamber, the method comprising:
   a first process of conducting a plasma processing by introducing a mixture gas at least including HBr and $N_2$ as the process gas to thereby round a boundary between a mask and an upper portion of a sidewall of the trench;
   a second process of conducting a plasma processing to form the trench in the silicon of the silicon substrate; and
   a third process of conducting a plasma processing by introducing a mixture gas including at least HBr and $Cl_2$ as the process gas to thereby round a bottom portion of the trench.

2. The method of claim 1, wherein the first process is conducted under a condition where a pressure within the processing chamber is at most not greater than 6.7 Pa (50 mTorr); a ratio of a flow rate of HBr to a flow rate of $N_2$ among the process gas is equal to or greater than 3; and a bias high frequency power applied to an electrode provided in the processing chamber to generate plasma is 100 W or larger.

3. The method of claim 1, wherein the third process is conducted under a condition where a pressure within the processing chamber is at least 20 Pa (150 mTorr) or greater; a ratio of a flow rate of HBr to a flow rate of $Cl_2$ among the process gas is equal to or greater than 2; and a bias high frequency power applied to an electrode provided in the processing chamber to generate plasma is 50 W or larger.

4. The method of claim 1, wherein a time period during which the plasma processing is conducted in the first process is shorter than a time period during which the plasma processing is conducted in the second process.

5. The method of claim 4, wherein a ratio of the time period during which the plasma processing is conducted in the second process to the time period during which the plasma processing is conducted in the first process is 1 to 0.15~0.5.

6. The method of claim 1, wherein a time period during which the plasma processing is conducted in the third process is shorter than a time period during which the plasma processing is conducted in the second process.

7. The method of claim 6, wherein if a ratio of the time period during which the plasma processing is conducted in the second process to the time period during which the plasma processing is conducted in the third process is 1 to 0.3~0.7.

* * * * *